United States Patent [19]
Takahashi

[11] Patent Number: 5,896,341
[45] Date of Patent: Apr. 20, 1999

[54] SYNCHRONOUS SEMICONDUCTOR MEMORY CIRCUIT

[75] Inventor: Hiroyuki Takahashi, Tokyo, Japan

[73] Assignee: NEC Corporation, Tokyo, Japan

[21] Appl. No.: 08/879,215

[22] Filed: Jun. 19, 1997

[30] Foreign Application Priority Data

Jun. 21, 1996 [JP] Japan ................... 8-161505

[51] Int. Cl.$^6$ .................................................. G11C 8/00
[52] U.S. Cl. .................. 365/230.06; 365/230.02; 365/230.08; 365/233
[58] Field of Search ................ 365/230.06, 230.08, 365/233, 230.02

[56] References Cited

U.S. PATENT DOCUMENTS 5,497,355  3/1996  Mills et al. ................ 365/230.08

FOREIGN PATENT DOCUMENTS

A 2-3177    1/1990  Japan.
A 2166696   6/1990  Japan.
A 5144269   6/1993  Japan.
A 8147964   6/1996  Japan.

*Primary Examiner*—Do Hyun Yoo
*Attorney, Agent, or Firm*—Sughrue, Mion, Zinn, Macpeak & Seas, PLLC

[57] ABSTRACT

A synchronous semiconductor memory circuit permits faster capture of data and faster transfer of internal data. The output of a master latch circuit (11) of an input register (5A) serves as an output signal (A1) of the register, and an output (RA) of a slave latch circuit (12) is fed back to the input. A multiplexer (4A) for switching between the output and an input signal (A) is disposed before an input register (5A) to control a switching signal (burst operation) depending on whether there is an external input signal to be captured. At the same time, an internal pulse (CP2) is generated by a clock edge and applied to a decoder circuit (7A) and used as a pulse forming signal.

13 Claims, 8 Drawing Sheets

5,896,341

1

SYNCHRONOUS SEMICONDUCTOR MEMORY CIRCUIT

BACKGROUND OF THE INVENTION

1. Field of the Invention

The present invention relates to a synchronous semiconductor memory circuit and, more particularly, to a synchronous semiconductor memory circuit having an input register which captures input data at the voltage edge of each clock control signal.

2. Description of the Related Art

A synchronous memory has a clock input CLK which is a control signal for capturing or holding an input signal; a register or latch circuit provided for each input is controlled according to the foregoing control signal so as to eliminate the variations in respective input signals before introducing them inside. Once the input signals are taken in, changes in the input signals cause no problem because the input data can be held internally. To be more specific, storing operation is not affected by a shifted or reduced timing width of input information received from outside, thus making the synchronous memory suited for accomplishing higher operating frequencies. This concept is basically involved in designing a computer system; such a clock control register IC or the like has been installed in an input signal generating section of an synchronous memory. In recent years, there has been an increasing trend toward incorporating such a clock control register IC in the memory in order to achieve higher speed and also to reduce the number of ICs on a system board.

Referring to FIG. 6, a burst SRAM having an input register will be described as a conventional example of a synchronous memory circuit. The burst is a function for holding address data received from outside as it is, while generating a part of address data internally; this function is required for SRAM employed as a cache memory. A burst switching logic is added to a clock control path. An input address Add passes through an input buffer 1 and it is supplied as an internal signal A to a register circuit 5A.

A control signal CLK turns into an internal clock signal C via a buffer 3; likewise, a burst switching signal Burst turns into an internal signal B via a buffer 2. These signals B and C undergo the logical operation performed by a multiplexer 4B; the signals B and C turn into a register control clock CB via a buffer 10 before it is applied to a plurality of registers 5A. In an example of the circuit of the multiplexer 4B shown in FIG. 7, one of two input signals C1 and C2 is selected based on the control signal B. Pairs of a p-channel MOS transistor (pMOS) and an n-channel MOS transistor (nMOS) compose transfer switches 21 and 22, respectively. The selected transfer switch 21 or 22 based on the control signal B is turned ON so as to take out the selected input signal as an output CB. The input register 5A accepts the output A of the buffer 1 as input data; it is composed of a latch circuit 11, i.e. a master latch circuit, which uses the register control clock CB as a latch clock and another latch circuit 12, i.e. a slave latch circuit, which receives the output of the latch circuit 11 as input data thereof and uses the inverted signal of the register control clock CB, which has been issued by an inverter 13, as a latch clock. FIG. 8 shows an example of the latch circuits 11 and 12, wherein pMOS and nMOS serving as a transfer switch 31 are connected to an input IN, and the output thereof passes through an inverter 33 to provide an output OUT. At the same time, the signal of the output OUT is inverted by an inverter 34, then the inverted signal passes through the pMOS and nMOS of a transfer

2 switch 32 to be fed back to the input end of the inverter 33. When the output CB is at low level, the transfer switch 31 turns ON and the transfer switch 32 turns OFF, thus setting a through mode. Conversely, when the output CB is at high level, the transfer switch 31 turns OFF and the transfer switch 32 turns ON, thus setting a latch mode by the flip-flop formed by the two inverters 33 and 34. An output A1 of the input register 5A provides an input signal of a decoder circuit 7A which passes through three AND gates 14, 15, and 16 to select a word line WL in this circuit example. It is necessary to add a signal CD for forming WL into a pulse signal to the signal applied to the last AND gate 16. For this purpose, a circuit method known as "pulse word" is used because, in the case of a synchronous system, the timing at which internal circuitry is actuated by the control signal CLK can be controlled, so that a memory cell is selected only for a required time. This method makes it possible to limit the time during which the circuit is in an activated state, permitting power saving or a longer time allowed for precharging of a digit line, contributing to higher speed. The pulse signal CD is generated as a one-shot pulse based on the internal clock C by a pulse generating circuit 6 and it is made via a delaying circuit 8B for adjusting timing. As shown by a circuit example in FIG. 9, the pulse generating circuit 6 is constituted by an input C and an AND gate 42 which accepts the output of an inverting logic circuit 41 serving also as a delay circuit.

The operation of the conventional circuit will be described with reference to FIG. 10 which shows a timing chart. The internal signal C of the control signal CLK is controlled by the internal signal B in the multiplexer 4B. Then the internal signal B is at the low level, data is accepted from outside, and the internal clock C is transferred to the output CB so that the signal is distributed to each register circuit 5A in a chip. When the internal signal B is at the high level, the burst mode is engaged; the output CB is fixed at the low level and therefore no data can be taken in from outside. The relationship of timing between the output CB and an address input A coming into the input register 5A is represented by setup ts and hold tH in the chart. Ideally, the timing margin is maintained so that ts and $t_H$ are equal. The output CB has a large delay because it actuates all the input registers 5A, while the internal signal A has a small delay because it actuates only one input buffer. Hence, the signal CB is designed to be the quickest and the internal signal A is delayed to make adjustment according to the signal CB. In the input register 5A, at the rising edge of the output CB, the master latch circuit 11 in a first stage changes from the through mode to the latch mode to hold data; at the same time, the slave latch circuit 12 in the following stage unlatches the retained data of the preceding cycle, and new data of the master latch circuit 11 in the first stage is transferred internally in the through mode. This operation captures the input address Add at the edge of the control signal CLK; the time elapsed from the signal CB to the signal A1 is the delay time at the input register 5A. The time elapsed from the internal signal A1 to an internal signal A3 is the delay time at the decoding circuit 7A; the pulse signal CD must be later than the signal A3. More specifically, without timing margin tm, a selected pulse would undesirably be issued after the pulse of preceding data is issued, resulting in multiple selection or variations in pulse width. To secure the time margin tm, a pulse signal CP produced by the pulse generating circuit 6 need to be provided with delay by the delay circuit 8B. In this way, the WL pulse always starts and ends at the timing determined by the CD pulse, ensuring stable pulse operation independent of a cycle time.

In the conventional synchronous memory circuit described above, the delay of the critical path from the input of the control signal CLK to the WL selection involved in the section from the input register 5A to the decoder circuit 7A for the pulse word selection may be represented by the total of the delay elements shown below:

1. From the input of the control signal CLK to the generation of the internal clock C: CLK→C
2. Distribution to the multiplexer 4B and all the input registers 5A: C→CB
3. Output delay of the registers 5A: CB→A1
4. Delay of decoder: A1→A3
5. Timing margin relative to pulse signal A3: tm
6. Delay of the word driver in the last stage: CD→WL The circuitry must be designed to minimize the total of the above delay elements to achieve higher speed; however, merely minimizing the total delay is not enough for accomplishing markedly higher speed. Achieving higher speed of the critical path is becoming indispensable for realizing a synchronous memory which operates at a higher operating frequency.

SUMMARY OF THE INVENTION

Accordingly, an object of the present invention is to provide a synchronous semiconductor memory circuit which is capable of capturing data and transmitting internal data at higher speed.

A semiconductor memory device according to the present invention include a plurality of input registers having a master latch circuit which captures an input signal at a voltage transition edge of a clock control signal, and a slave latch circuit which captures an input signal latched in the master latch circuit at the voltage transition edge of an inverted signal of the clock control signal, a plurality of multiplexers which select an external input signal or an output signal of the slave latch circuit of the input register and supply an output to corresponding one of the input registers, a pulse generating circuit which generates a pulse signal synchronized with the clock control signal, and a decoder circuit which receives the output signals of the master latch circuit of the plurality of input registers and the pulse signal.

The output from the master latch circuit of the first stage constituting the input register is used as the output of the register. This places the input register in the through mode at the setup of the input address Add, so that the data from the external input of the input address Add is supplied asynchronously to the decoder circuit before the rising edge of the control signal of the input register is transferred to the input register. This enables quicker selection at the decoder. Increasing the margin relative to a pulse signal permits reduced delay at the delay circuit; reversing the output of the pulse generating circuit and the decoder signal A3 eliminates the need of the delay circuit itself.

In the burst mode, the data in the input registers must be held without accepting the input address Add, whereas the data cannot be held because the input registers are set in the through mode at the time of setting up the foregoing input address Add. Therefore, a path is provided so that the outputs of the input registers, i.e. the outputs of the slave latch circuit, are fed back to the input during the burst mode, thereby making it possible to change the logic relative to the input signal A supplied to the input registers according to the burst switching signal Burst. Specifically, the logic function based on the burst switching signal Burst is transferred from a control clock CLK path over to an address signal Add path.

According to another aspect of the present invention, there is provided a semiconductor memory device which includes a plurality of input registers which capture an input signal at a voltage transition edge of a clock control signal, a pulse generating circuit which generates a pulse signal synchronized with the clock control signal, and a decoder circuit which receives an output signal of the plurality of input registers and the pulse signal.

The clock control signal may be clock generated internally by using the edge of an external input clock as the reference.

The input signal can be an address signal and the control signal of the multiplexer can be the changing signal of the burst operation for automatically generating the address signal internally. The decoder circuit may be an address decoder circuit.

A part of the decoder circuit before performing the logical operation based on the pulse signal can be disposed in a stage preceding the multiplexer A delay circuit for adjusting timing may be inserted in an input path of the control signal of the multiplexer.

Further, the pulse signal may be employed as the clock control signal of the input register.

BRIEF DESCRIPTION OF THE DRAWINGS

The above and other objects, features and advantages of the present invention will be apparent from the following description taken in conjunction with the accompanying drawings, in which.

DESCRIPTION OF THE PREFERRED EMBODIMENTS

The embodiments of the present invention will now be described with reference to the accompanying drawings.

Figure 1:
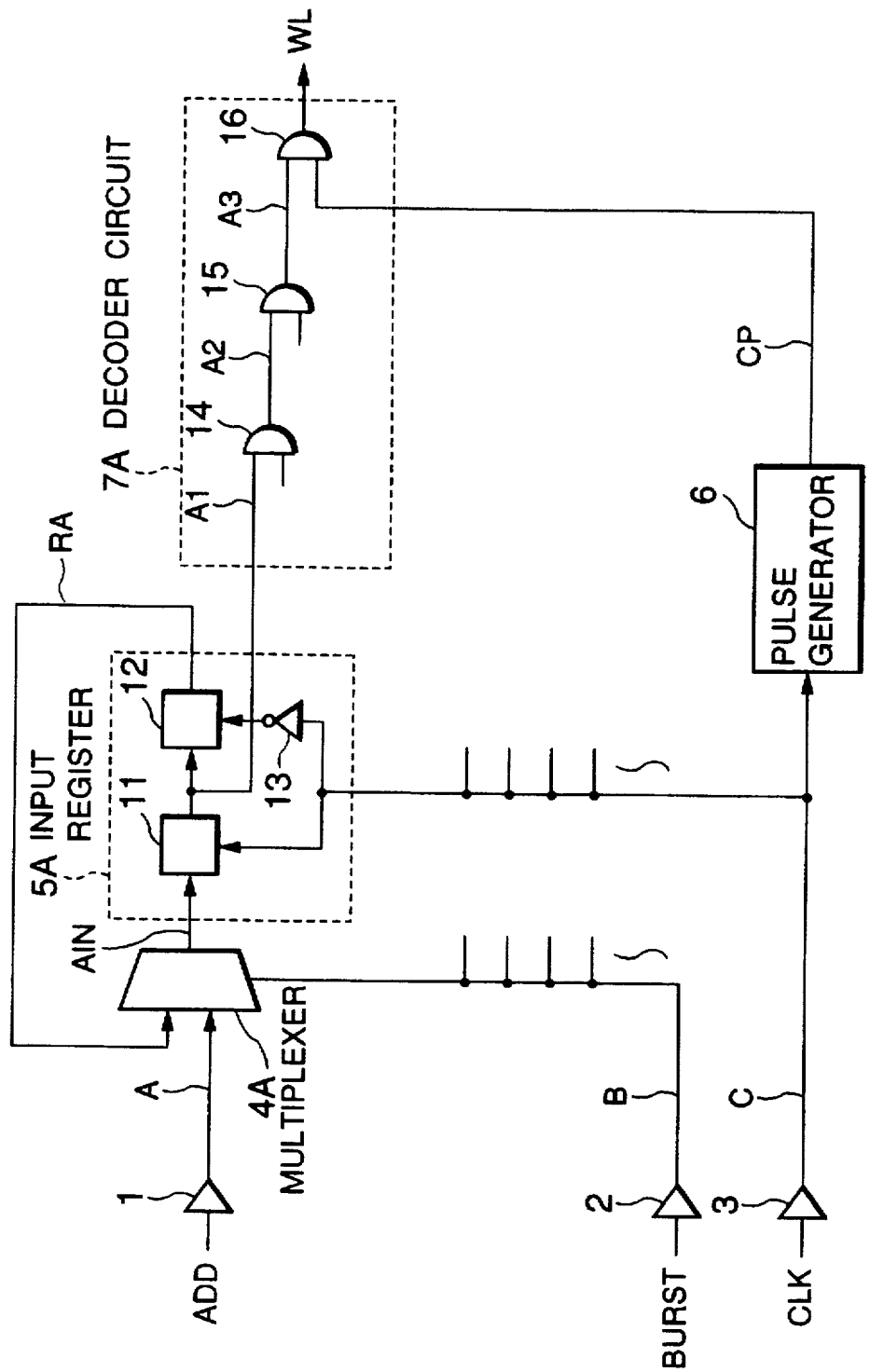
FIG. 1 is a circuit diagram showing a synchronous semiconductor memory circuit of a first embodiment of the present invention.

FIG. 1 is a circuit diagram illustrating a semiconductor memory circuit of a first embodiment in accordance with the present invention.

The synchronous semiconductor memory circuit of this embodiment is responsible for the process from the input of an address Add of a burst SRAM, a clock CLK, and a burst switching signal to the selection of a word line WL via an input register 5A and a decoder circuit 7A. The input address Add goes through an input buffer 1 and turns into an internal signal A; the clock signal CLK goes through a buffer 2 and turns into an internal clock signal C; and a burst switching signal Burst also goes through the buffer 2 and turns into an internal signal B. The internal signal A and an output RA of an input register 5A are supplied to a multiplexer 4A wherein the logical operation for switching is performed using the internal signal B, and an output AIN thereof is received as the input data by the register circuit 5A. The register circuit 5A is directly controlled by the internal clock signal C to drive a plurality of input registers 5A present in a chip at the same time. The output RA of the input registers 5A is fed back to the multiplexer 4A located before the input registers 5A, and the signal transferred from a master latch circuit 11 in a first stage to a slave latch circuit 12 in the following stage is supplied as an intermediate output A1 to a decoder circuit 7A. This circuit example is adapted to select a word line WL through three stages of AND gates 14, 15, and 16. It is required to provide the signal, which is supplied to the last AND gate 16, with a signal for making the word line WL a pulse. This is necessary for the word line WL to select a pulse word by a one-shot pulse CP generated by a pulse generating circuit 6 in response to the internal signal C received.

The operation of the circuit of this embodiment will now be described in conjunction with the timing chart shown in FIG. 2. The internal signal A based on the input address Add undergoes the logical operation based on the internal signal B in the multiplexer 4A; when the internal signal B is at the low level, data is accepted from outside and the data from the internal signal A is supplied as an input AIN to the input register 5A. The internal signal C based on the clock CLK is directly distributed to the respective input registers 5A in the chip; therefore, the data is securely held in the input registers 5A at the rising edge of the clock CLK. When the internal signal B is at the high level, a burst mode is set; the data from RA which is another signal supplied to the multiplexer 4A is entered as an output AIN to the input registers 5A, however, the data output as RA from the input register 5A has been captured in the preceding cycle, and therefore, supplying the data to the input register 5A again causes the burst mode to be set and no change occurs in the internal address data The timing relationship between the internal signal C and the input data AIN supplied to the input register 5A is represented by setup ts and hold $t_H$ shown in the timing chart; the timing margin is adjusted by delaying the AIN path so that ts and tH are equal The internal signal C actuates all the input registers 5A, while the internal signal A actuates only one input register 5A with consequent less delay, permitting easy insertion of the multiplexer 4A therebetween. This allows MUX logic to be deleted from the distribution path of the internal signal C, thus achieving higher speed of the internal clock path than in the conventional circuit. In the input register 5A, the master latch circuit 11 in the first stage switches from a through mode to a latch mode so as to hold the data; at the same time, the slave latch circuit 12 in the following stage unlatches the data which has been held in the preceding cycle and outputs the new data in the master latch circuit in the first stage to the register output RA. On the way to the decoder circuit 7A, the data is supplied to an intermediate output A1 of the master latch circuit 11 of the input register 5A before the master latch circuit 11 is set in the latch mode. The input AIN is decided by the input address Add and the burst switching signal Burst while the level of the internal signal C is still low, and the data is supplied to A1 beforehand via the input register 5A which is in the through mode. The speed is not decided by the internal signal C; it is decided by the input path from the input address Add and the burst switching signal Burst. The setup time for the input signals should be longer to accomplish higher speed of A1; however, hold time $t_H$ of the registers must be secured, so that speeding up the internal signal C is effective. The time required for the transfer from A1 to A3 indicates the delay in the decoder circuit 7A; a pulse signal CP must be later than A3. In other words, the timing margin tm is necessary to prevent multiple selection (a selection pulse is issued after the pulse of preceding data is issued) or variations in pulse width. In the conventional example, the signal CP which has been turned into a pulse by the pulse generating circuit 6 is delayed by a delay circuit 8B in order to secure tm, whereas it is no longer necessary to make delay in the path from the signal CP because of the higher speed of A3 achieved in this embodiment. Obviously, however, the delay circuit is still required for a circuit which has a significant delay in the decoder path. When the internal signal C switches from the high to low level in the input register 5A, the captured data is latched and the data is saved while the clock signal CLK is at the high level. When the internal signal C switches back to the low level, indeterminate data from outside comes in the decoder circuit 7A through the input register 5A; however, if the word selection by the internal pulse CP has been completed before the data comes in, then no word line WL selection error will occur.

In the circuit of this embodiment, it is seen from the timing chart that the critical path involved until the word line WL is selected has been replaced by a path extending from the clock signal CLK to the selection of the word line WL via the pulse generating circuit 6. The delay in the path is represented as the total of the time lags or delays shown below:

1. From the input of the clock signal CLK to the generation of the internal clock: CLK→C
2. Delay in the pulse generating circuit 6: C→CP
3. Delay in the decoder (only in the latter half): CP→WL The total delay indicates marked improvement over the conventional circuit. For example, in a 1M-bit class SRAM circuit, the total of delays from CLK to WL is shortened, permitting higher speed, namely, from 5.5 ns to 4.5 ns, the improvement being approximately 20%.

Figure 3:
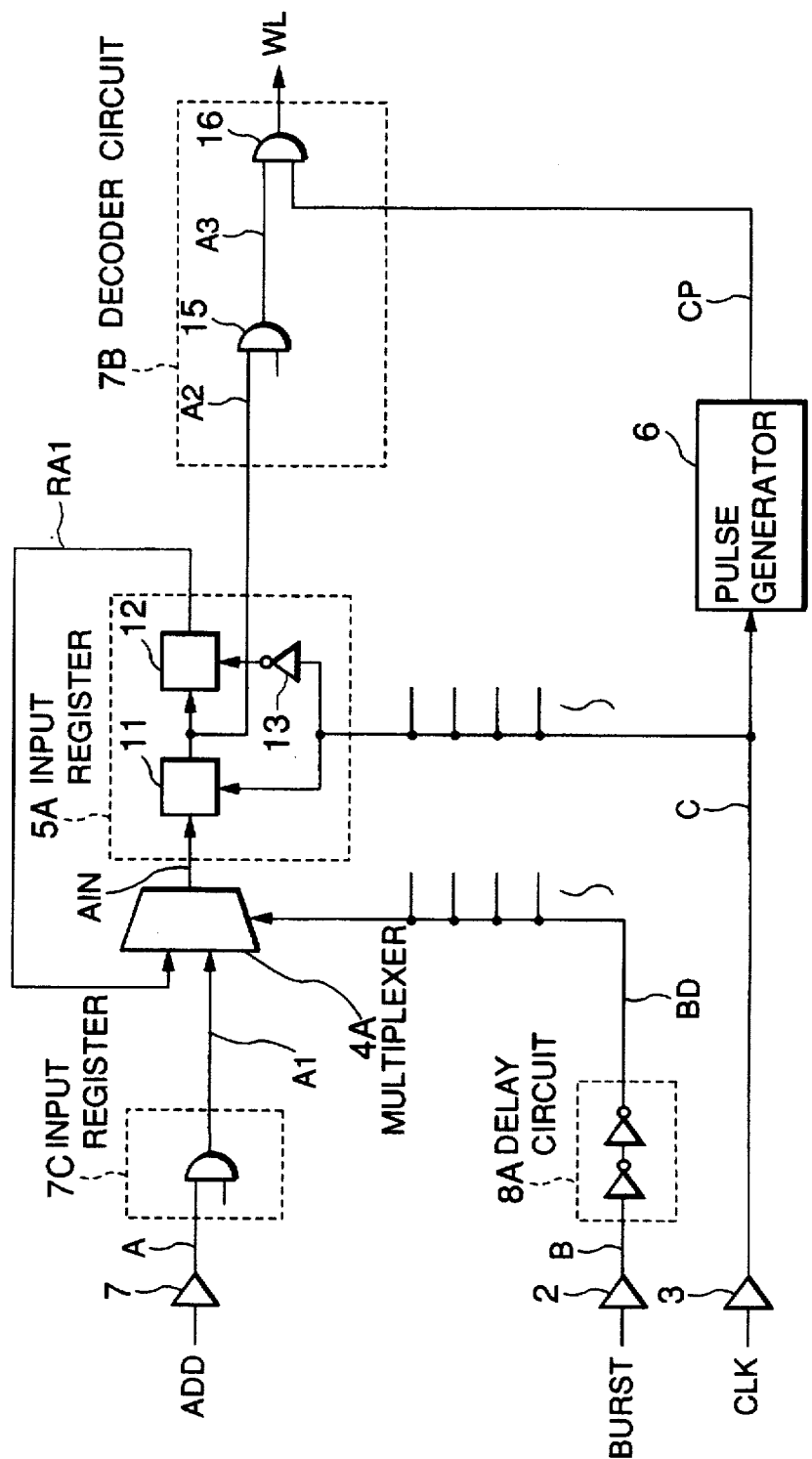
FIG. 3 is a circuit diagram showing a synchronous semiconductor memory circuit of a second embodiment of the present invention.

FIG. 3 is a circuit diagram showing a semiconductor memory circuit according to a second embodiment of the present invention. In the second embodiment, a part of the decoder circuit 7A following the input register 5A in the first embodiment has been moved and it is disposed before the multiplexer 4A. Further, a delay circuit 8A for adjusting timing is inserted to the path extending from the input of the burst switching signal Burst to the multiplexer 4A, and an output BD of the delay circuit 8A provides the switching signal of the multiplexer 4A.

In the timing of the input register 5A, if the internal signal AIN is faster due to a slow speed of the internal signal C and a large setup requirement of the address signal Add input, then a larger timing margin ts can be set between AIN and C. More specifically, the path to the internal signal AIN has a time allowance, so that a part 7C of the decoder circuit 7A can be moved to the stage before the input register 5A and the multiplexer 4A. This makes it possible to reduce the number of stages following the input register 5A in the decoder circuit. Hence, even in the case of a circuit having a large memory capacity and a large delay in the decoder, WL can be determined by the path CP on the pulse generating end, permitting the advantage of the present invention to be exhibited even better.

Figure 4:
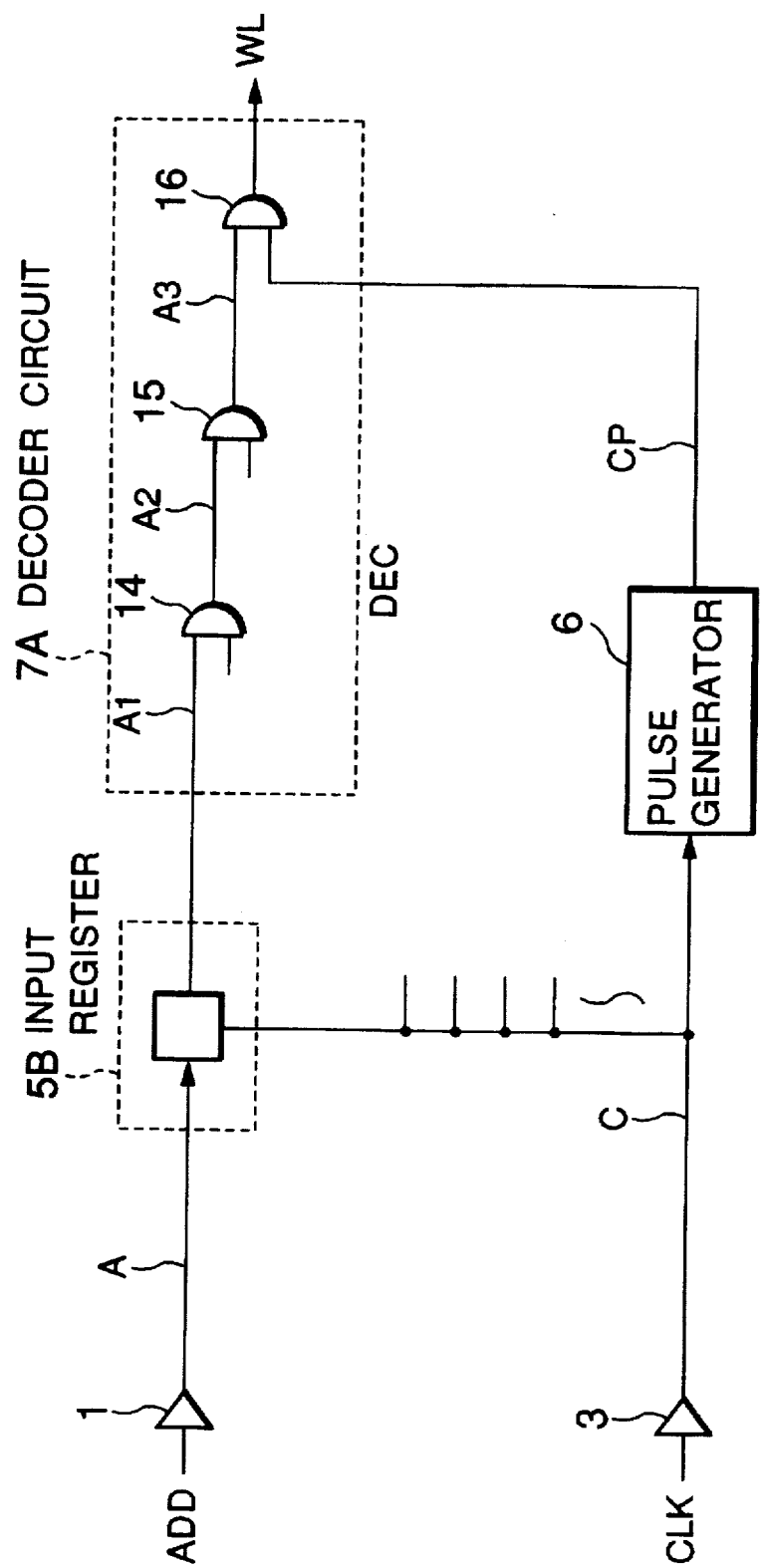
FIG. 4 is a circuit diagram showing a synchronous semiconductor memory circuit of a third embodiment of the present invention.

FIG. 4 is a circuit diagram of the semiconductor memory circuit according to a third embodiment of the present invention. In this embodiment, the slave latch circuit 12 of the input register 5A in the first embodiment has been deleted in forming an input register 5B which is essentially a latch circuit; the multiplexer 4A preceding the input register 5B and the switching signal B and the input signal Burst thereof have also been deleted in the third embodiment.

The circuit configuration in FIG. 4 indicates a synchronous SRAM without burst logic. In the case of the synchronous circuit wherein data is captured at the rising edge of the clock signal CLK, a register circuit as indicated by the input register 5A in the conventional example is generally provided for the input; however, this embodiment utilizes synchronization with internal pulse word logic to avoid problems in the circuit operation. In this circuit also, the decoder circuit 7A starts operating earlier by the setup time from the address signal Add, accomplishing a shorter time required for the completion of WL selection. Further in this embodiment, the circuit scale of the input register 5B is reduced; therefore, the driving load of the internal clock signal C is accordingly reduced, enabling higher speed and also reduced cost because of the smaller layout area required on a chip.

Figure 5:
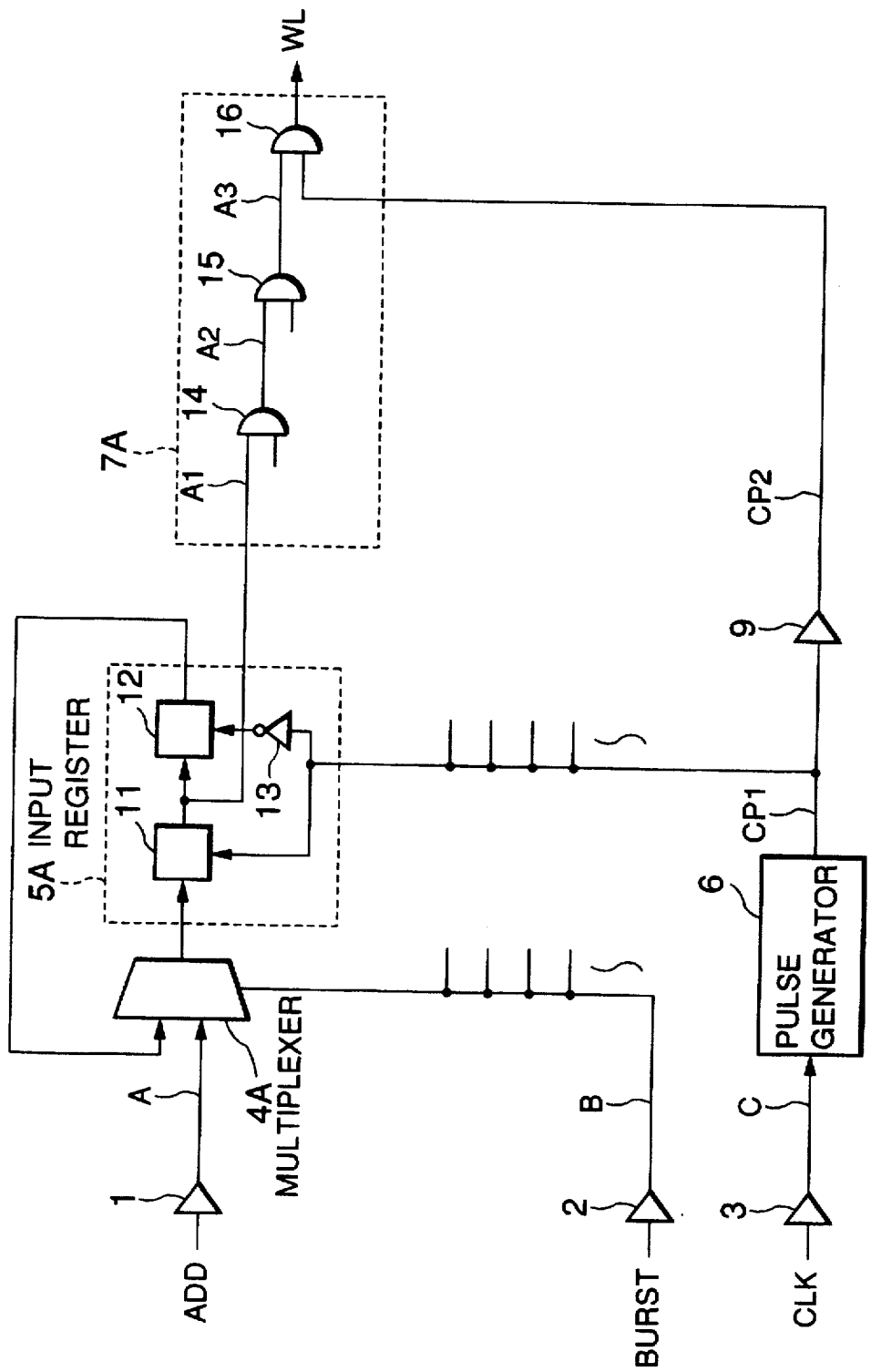
FIG. 5 is a circuit diagram showing a synchronous semiconductor memory circuit of a fourth embodiment of the present invention.
Figure 6:
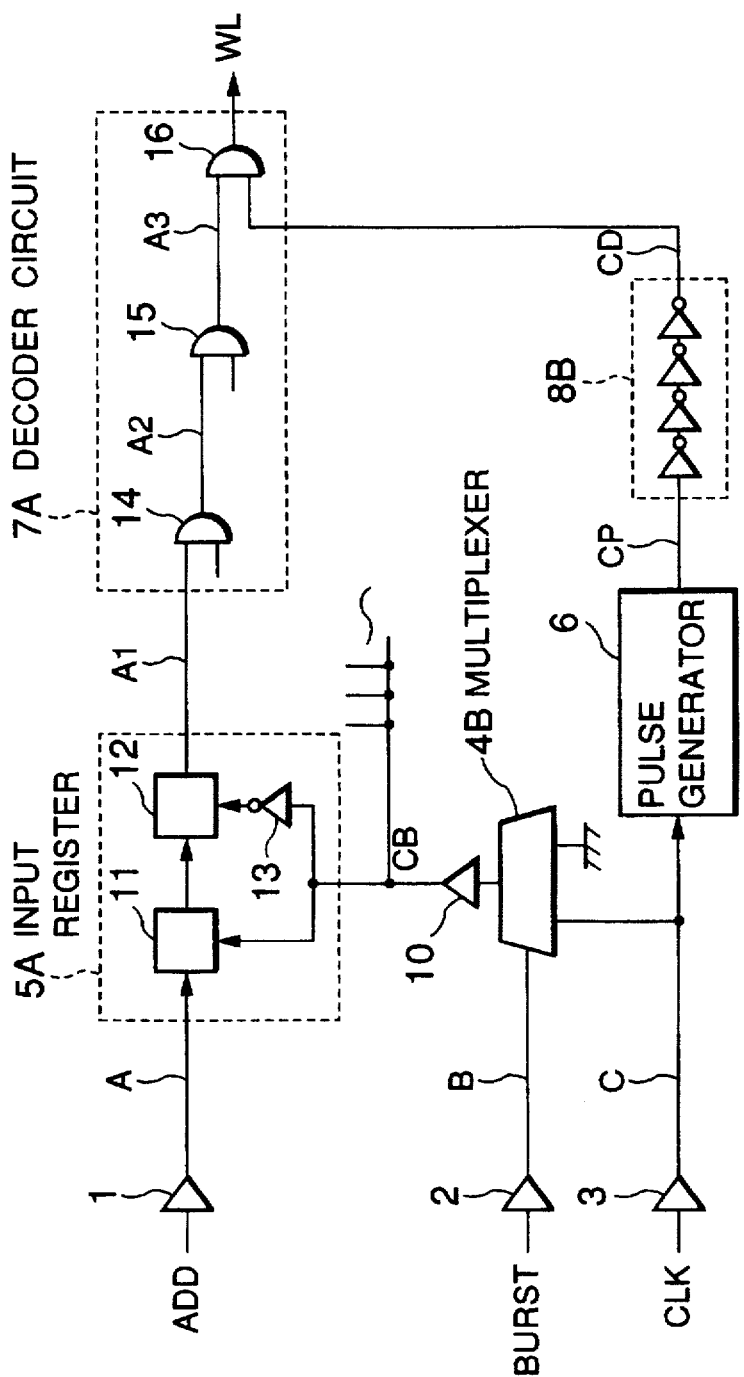
FIG. 6 is a circuit diagram showing a conventional semiconductor memory circuit.
Figure 7:
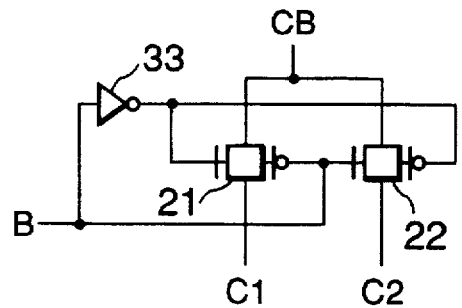
FIG. 7 is a circuit diagram showing an example of a multiplexer (4A)
Figure 8:
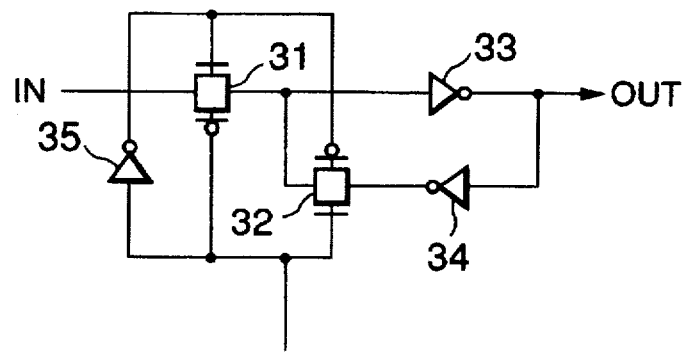
FIG. 8 is a circuit diagram showing an example of a latch circuit (11, 12)
Figure 9:
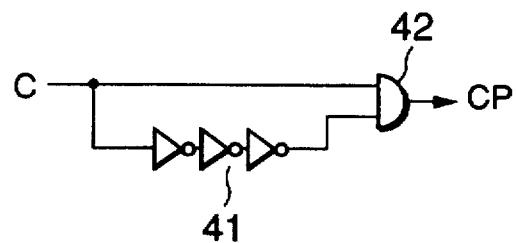
FIG. 9 is a circuit diagram showing an example of a pulse generating circuit (6)
Figure 10:
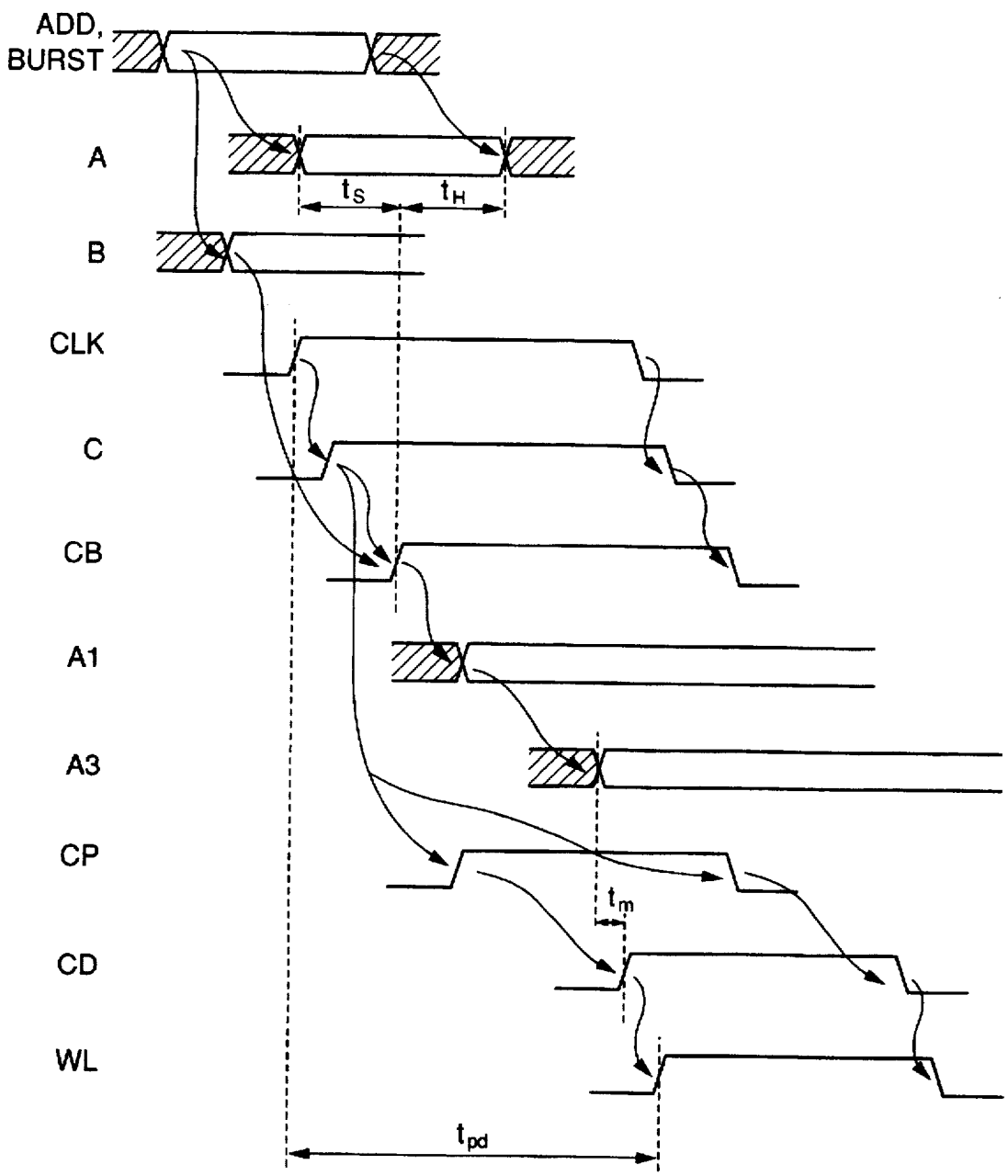
FIG. 10 is a diagram illustrating the waveform of the internal operation of the conventional example shown in FIG. 6.

FIG. 5 is a circuit diagram of a semiconductor memory circuit according to a fourth embodiment of the present invention. In this embodiment, an output CP1 of the pulse generating circuit 6 which receives the internal clock signal C as the input thereof in the first embodiment is employed as the control signal of the respective input registers 5A. The output CP1 also provides the pulse forming signal supplied as CP2 to the decoder circuit 7A via a buffer 9.

Figure 2:
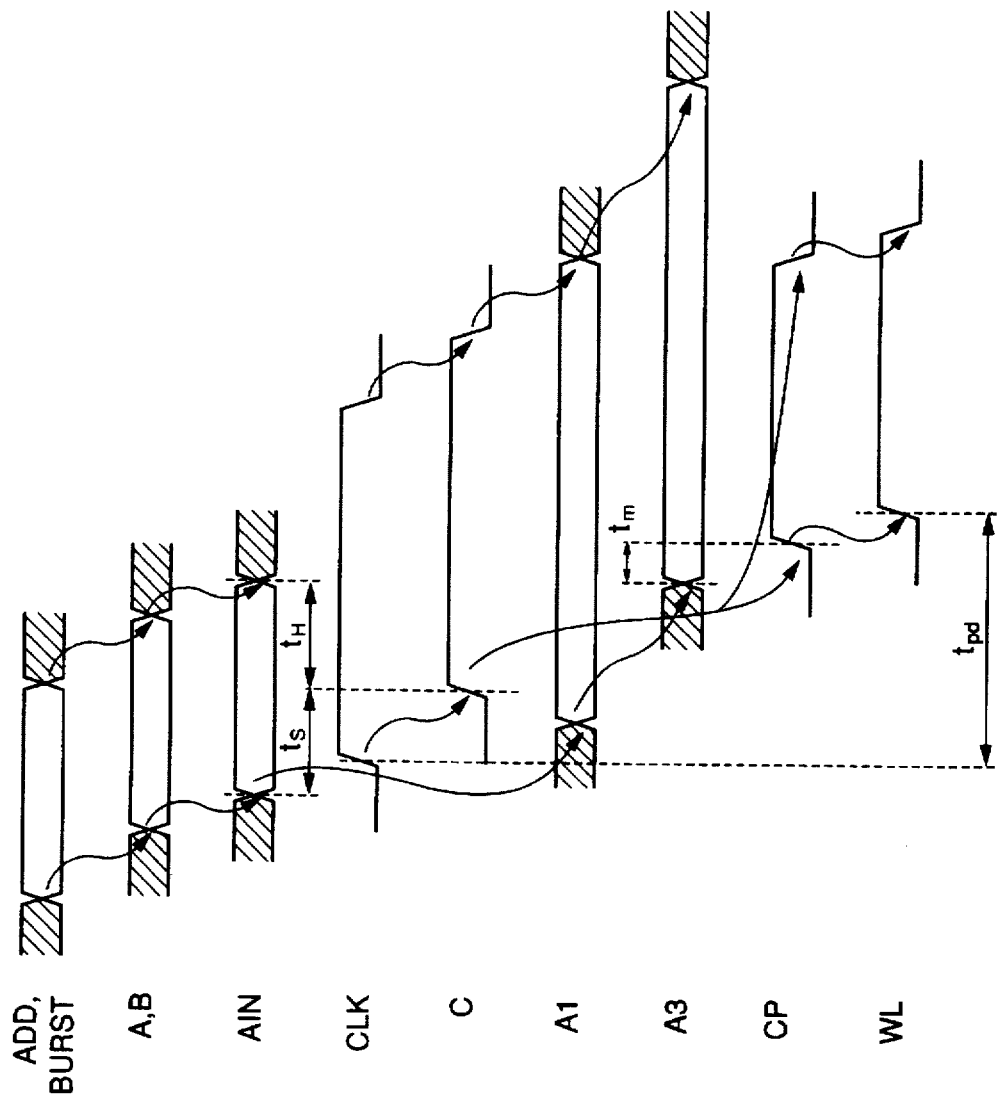
FIG. 2 is a diagram illustrating the waveform of the internal operation of the embodiment shown in FIG. 1.

The fourth embodiment is based on the assumption that the pulse width from the rising edge of the clock signal CLK at which data is captured to the falling edge, i.e. the time during which high voltage is applied, is shorter and the indeterminate data of the internal signal A3 in the timing chart shown in FIG. 2 arrives earlier. Specifically, if indetermination data of the internal signal A3 is received before the pulse forming signal CP2 is completed, then an erroneously selected pulse occurs in the vicinity of the end of an internal word pulse. To prevent this, according to this embodiment, the pulse generating circuit 6 generates a particular internal pulse which is independent of the high potential pulse width of the clock signal CLK, and the pulse end signal is used to set the input register 5A to the through mode so as to render the internal signal A3 indeterminate through the decoder circuit 7A. The same pulse end signal is used to decide the end of the pulse forming signal, the internal signal CP2, via the buffer 9. The comparison between the path extending from the internal signal CP1 to A3 and the path extending from the internal signal CP1 to CP2 shows that the path to the internal signal A3 is apparently slower because of more stages included in the circuit, thus enabling the timing margin corresponding to the foregoing time lag to be secured. Hence, even when the high potential pulse width of the clock signal CLK is smaller, no selection error will occur at the end of the word pulse.

Thus, the output of the master latch circuit of the input register is employed as the output signal of the register for the setup of the address signal before the data capturing clock edge is received, while the data of the internal register must be held without accepting any address input in the burst mode; therefore, according to the present invention, a path for feeding the output of the slave latch circuit of the register back to the input is provided, and the circuit for switching between the path and the address signal path is disposed before the register, and the internal pulse is generated by the clock edge and applied to the stage following the register and after to use it as the pulse forming signal, thereby enabling data from the address external input to be supplied to the decoder asynchronously before the edge of the clock signal reaches the register with resultant quicker selection in the decoder. Furthermore, since the logic circuit for burst switching is removed from the internal clock distribution path, allowing the path to be sped up. As a result of the foregoing advantages, the delay from the input of the clock to the selection of the word line has been shortened by about 20%, helping greatly to achieve a higher operating frequency.

What is claimed is:

1. A semiconductor memory device comprising:
    a plurality of input registers each having a master latch circuit which captures an internal input signal at a voltage transition edge of a clock control signal and a slave latch circuit which captures an input signal latched in said master latch circuit at a voltage transition edge of an inverted signal of said clock control signal;
    a plurality of multiplexers each selecting an external input signal or an output signal of the slave latch circuit corresponding to one of said input registers and supplying a selected one of said external input signal and said output signal to the corresponding one of said input registers;
    a pulse generating circuit for generating a pulse signal synchronized with said clock control signal; and
    a decoder circuit which receives an output signal of the master latch circuit of each of said plurality of input registers directly and said pulse signal.

2. The device as claimed in claim 1, wherein said clock control signal is generated internally by using the edge of an external input clock.

3. The device as claimed in claim 1, wherein said external input signal is an address signal, a control signal of said multiplexers is a switching signal of a burst operation for automatically generating the address signal internally, and said decoder circuit is an address decode Circuit.

4. The device as claimed in claim 1, further comprising: at least one register receiving an address signal and outputting said external input signal to at least one of said multiplexers.

5. The device as claimed in claim 5, further comprising a delay circuit for adjusting the timing of a received control signal and coupled to said multiplexers.

6. The device as claimed in claim 1, wherein said pulse signal is employed as a clock control signal for said input registers.

7. A semiconductor memory device comprising:
    a plurality of input registers each having a master latch circuit and a slave latch circuit, said master latch circuit capturing an input signal at a voltage transition edge of a clock control signal to output a first signal, said slave latch circuit capturing said first signal at a voltage transition edge of an inverse signal of said clock control signal;
    a pulse generating circuit for generating a pulse signal synchronized with said clock control signal; and
    a decoder circuit which receives said first signal of each of said plurality of input registers directly and said pulse signal.

8. The device as claimed in claim 2, further including a clock control signal generator for generating said clock control signal from an edge of an external input clock.

9. The device as claimed in claim 2, wherein each of said master latch circuits receives said input signal at said voltage transition edge of said clock control signal such that each of said master latch circuits is set to its through mode when said input signal is supplied to each of said master latch circuits so that each of said master latch circuits supplies said input signal as said first signal to said decoder circuit as soon as said input signal is supplied to each of said master latch circuits.

10. A semiconductor memory device comprising:

a multiplexer receiving an address signal, a burst signal, and a first signal and outputting a second signal;

a register having a first latch circuit and a second latch circuit, said first latch circuit receiving said second signal and a clock signal and outputting a third signal, said second latch circuit receiving said third signal and an inverted signal of said clock signal and outputting said first signal;

a pulse generator receiving said clock signal and outputting a pulse signal, and a decoder circuit directly connected to said first latch circuit to receive said third signal directly and receiving said pulse signal to select a word line.

11. The device as claimed in claim 10, wherein said first latch circuit receives said second signal in response to said clock signal such that said first latch circuit is set to its through mode when said second signal is supplied to said first latch circuit so that said first latch circuit supplies said second signal as said third signal to said decoder circuit as soon as said second signal is supplied to said first latch circuit.

12. A semiconductor memory device comprising:

a multiplexer receiving an address signal, a burst signal, and a first signal and outputting a second signal;

a pulse generator receiving a clock signal and outputting a pulse signal;

a register having a first latch circuit and a second latch circuit, said first latch circuit receiving said second signal and said pulse signal and outputting a third signal, said second latch circuit receiving said third signal and an inverted signal of said pulse signal and outputting said first signal; and a decoder circuit directly connected to said first latch circuit to receive said third signal directly and receiving said pulse signal to select a word line.

13. The device as claimed in claim 12, wherein said first latch circuit receives said second signal in response to said pulse signal such that said first latch circuit is set to its through mode when said second signal is supplied to said first latch circuit so that said first latch circuit supplies said second signal as said third signal to said decoder circuit as soon as said second signal is supplied to said first latch circuit.

* * * * *